United States Patent
Konttinen

(10) Patent No.: US 7,801,197 B2
(45) Date of Patent: Sep. 21, 2010

(54) HIGH POWER LASER DEVICE

(75) Inventor: Janne Konttinen, Tampere (FI)

(73) Assignee: Epicrystals Oy, Tampere (FI)

( * ) Notice: Subject to any disclaimer, the term of this patent is extended or adjusted under 35 U.S.C. 154(b) by 0 days.

(21) Appl. No.: 11/454,631

(22) Filed: Jun. 16, 2006

(65) Prior Publication Data

US 2007/0291799 A1    Dec. 20, 2007

(51) Int. Cl.
*H01S 5/183* (2006.01)
*H01S 5/065* (2006.01)
*H01S 3/11* (2006.01)
*H01S 3/109* (2006.01)

(52) U.S. Cl. ............... 372/50.124; 372/18; 372/11; 372/22

(58) Field of Classification Search ............ 372/11, 372/50.124, 18, 22
See application file for complete search history.

(56) References Cited

U.S. PATENT DOCUMENTS

| | | | |
|---|---|---|---|
| 5,278,855 A * | 1/1994 | Jacobovitz-Veselka et al. | 372/44.011 |
| 5,408,486 A | 4/1995 | Shoji | |
| 5,574,738 A | 11/1996 | Morgan | |
| 6,026,108 A * | 2/2000 | Lim et al. | 372/50.11 |
| 6,404,797 B1 | 6/2002 | Mooradian | |
| 7,170,916 B2 * | 1/2007 | Kim | 372/50.124 |
| 2005/0002433 A1* | 1/2005 | Mooradian | 372/97 |
| 2005/0286593 A1* | 12/2005 | Guenter | 372/50.21 |
| 2006/0023757 A1 | 2/2006 | Mooradian et al. | |
| 2006/0029112 A1* | 2/2006 | Young et al. | 372/7 |

OTHER PUBLICATIONS

Fischer, A.J., "Bistable Output From a Coupled-Resonator Vertical-Cavity Laser Diode", Applied Physics Letters, 2000, vol. 77, No. 21, p. 3319-3321, entire document.
International Search Report mailed Oct. 9, 2007.
European Search Report dated Mar. 10, 2010.

* cited by examiner

Primary Examiner—Minsun Harvey
Assistant Examiner—Michael Carter
(74) Attorney, Agent, or Firm—Perman & Green LLP

(57) ABSTRACT

The invention is a single-crystal passively mode-locked semiconductor vertical-external-cavity surface-emitting laser (VECSEL). The device can be a single emitter or an array of emitters. The VECSEL structure is grown on a GaAs, InP or GaSb substrate. The device consists of an active region with a number of quantum wells (QW) made of GaInAs, GaInAsP, GaInNAs, GaInNAsSb, AlGaAs or GaAsP. The fundamental lasing wavelength is chosen by the gain material. The gain region is sandwiched between the bottom reflector with reflectivity close to 100% and a partial reflector. A semiconductor spacer layer made of e.g. GaAs or AlGaAs is separating the gain region and a semiconductor saturable absorber. The saturable absorber consists of one or more quantum wells made of GaInAs, GaInAsP, GaInNAs, GaInNAsSb, AlGaAs or GaAsP and a second partial reflector. The quantum wells can be of undoped, n-doped, p-doped or co-doped of such semiconductor material that the optical energy emitted by the gain medium is absorbed by the saturable absorber QW material. The n- and p-contacts are metalized on opposite sides of the semiconductor structure. The laser diode current is flowing through the layer structure partially saturating the semiconductor saturable absorber.

22 Claims, 5 Drawing Sheets

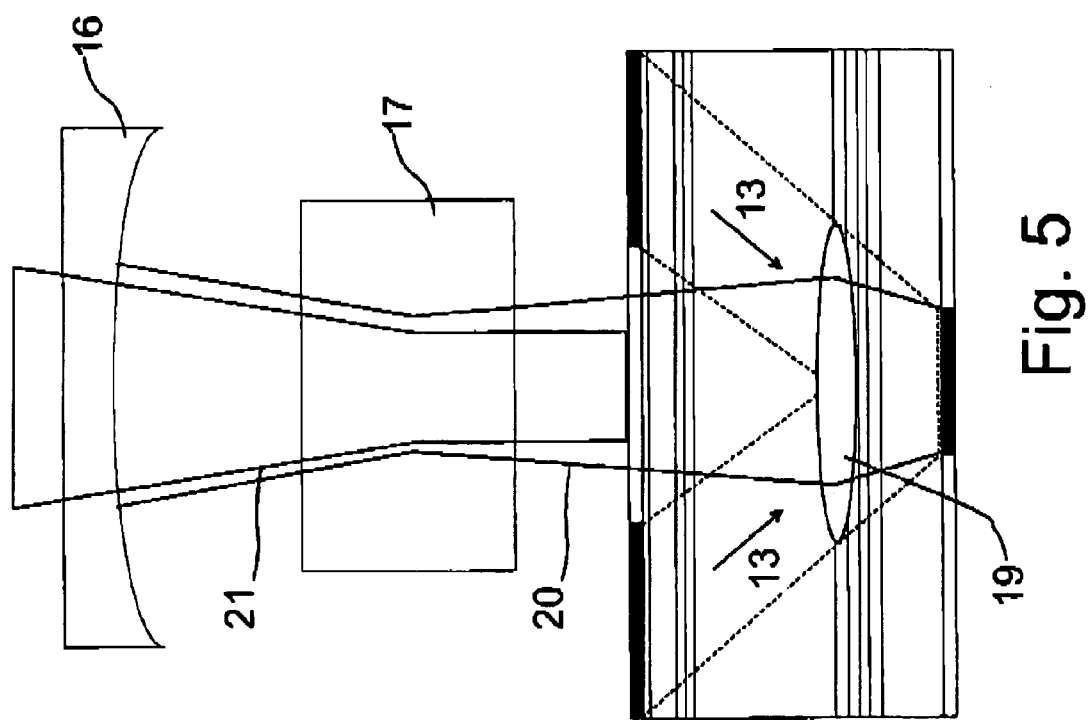

HIGH POWER LASER DEVICE

FIELD OF THE INVENTION

The present invention relates to a high power laser device, which comprises an active region with a number of quantum wells.

BACKGROUND INFORMATION

Laser devices in which mode-locking is achieved by an active modulator or by a passive, saturable absorber within the optical resonator of the laser devices are known. The mode-locking induces the laser to generate short pulses having a periodicity, which corresponds to the round-trip transit time of the light in the resonator. The optical loss of the saturable absorber in the resonator reduces with increasing intensity, thus short pulses can be generated by appropriately selecting the saturable optical loss. The frequency of the output signal of the mode-locked laser may also be doubled, tripled, or multiplied by another integer factor.

The US patent application 2006/0023757 discloses a mode-locked laser, system and method in which mode-locked optical pulses are frequency-converted using an intra-cavity frequency conversion. The mode-locked laser comprises an optical resonator, a laser gain element disposed in the optical resonator providing optical gain about a fundamental laser frequency, a mode-locking modulator disposed in the optical resonator, and a nonlinear optical material disposed in the optical resonator for performing optical frequency conversion in which an input pulse at the fundamental laser frequency is converted into an output pulse of reduced power at the fundamental laser frequency and an output optical pulse at a harmonic frequency. There is also an element disposed in the optical resonator which reduces the spatial, temporal or polarization overlap of output pulses at the harmonic frequency with optical pulses at the fundamental frequency and, thus, reduces the interference between the harmonic frequencies and the fundamental frequency. The mode-locked laser device can be reverse biased by supplying a voltage across the structure. For this purpose contact layers are provided: one at the bottom of the structure and the other one near the top of the structure. On the surface of the other contact layer is a coating, which is reflective at the harmonic frequency and antireflective at the fundamental frequency. The bias voltage may be modulated at a harmonic or sub-harmonic frequency determined by the cavity round-trip transit time.

The above referred laser uses active pulsing to improve second harmonic generation. The nonlinear material component of the laser converts the frequency of the radiation generated by the laser to a second harmonic frequency thus affecting that the infrared radiation is converted to visible radiation.

A semiconductor saturable absorber mirror (SESAM) is an optical semiconductor element comprising a saturable absorber with a certain optical loss. The optical loss reduces with increasing optical intensity of input radiation. Normally saturable absorbers in electrically pumped mode-locked VECSELs are used with a focusing lens to increase the intensity for saturation or by introducing reverse bias over the saturable absorber in order to temporarily reduce the absorption of the incident radiation. Saturable absorber mirrors are often implemented in laser cavities for passive mode-locking of lasers.

SUMMARY OF THE INVENTION

The present invention is a single-crystal passively mode-locked semiconductor vertical-external-cavity surface-emitting laser (VECSEL), a device comprising one or more lasers, i.e. a device having a single emitter or an array of emitters, and a method for passive mode-locking of a semiconductor vertical-external-cavity surface-emitting laser. The VECSEL structure is grown on a substrate made of semiconductor compounds. The device consists of an active region with a number of quantum wells (QW) made of another semiconductor compounds than the substrate. The fundamental lasing wavelength is chosen by the gain material. The gain region is sandwiched between the bottom reflector with reflectivity close to 100% and a partial reflector. A semiconductor spacer layer made is separating the gain region and a semiconductor saturable absorber.

The saturable absorber consists of one or more quantum wells and a second partial reflector. The quantum wells can be of undoped, n-doped, p-doped or co-doped of such semiconductor materials that the optical energy emitted by the gain medium is absorbed by the saturable absorber quantum well material. The n- and p-contacts are metallized on opposite sides of the semiconductor structure. The laser diode current (biasing current) is flowing through the layer structure partially saturating the semiconductor saturable absorber.

According to a first aspect of the present invention there is provided a laser comprising
a saturable absorber comprising at least one quantum well;
an active region with a number of quantum wells;
a bottom reflector;
a first partial reflector; and
a first contact and a second contact for conducting a biasing current through the saturable absorber to reduce saturation photon intensity in the saturable absorber;
wherein the intensity of the biasing current is configured to be selected to be below a saturation level of the at least one quantum well of the saturable absorber.

According to a second aspect of the present invention there is provided a device having at least one laser, which comprises
a saturable absorber comprising at least one quantum well;
an active region with a number of quantum wells;
a first contact and a second contact for conducting a biasing current through the saturable absorber to reduce saturation photon intensity in the saturable absorber;
wherein the intensity of the biasing current is configured to be selected to be below a saturation level of the at least one quantum well of the saturable absorber.

According to a third aspect of the present invention there is provided a method for passive mode-locking a laser comprising:
a saturable absorber comprising at least one quantum well;
an active region with a number of quantum wells;
a first contact; and
a second contact;
wherein the method comprises:
providing a biasing current flow between the first and the second contact of the laser flowing through the saturable absorber to reduce saturation photon intensity in the saturable absorber; and selecting the intensity of the biasing current to be below a saturation level of the at least one quantum well of the saturable absorber.

According to an example embodiment of the present invention the first and second contact layers are at least partially misaligned in the direction in which the radiation generated in the laser is configured to propagate in the laser, and that the second contact layer has a hole at the centre of the surface layer of the laser thus providing a dielectric coated output window for the radiation emitted by the laser.

The biasing current has the effect that the saturable absorber modulates the gain in the cavity as a function of intensity, which mode locks the laser without any active control. Therefore, high intensity mode-locked pulses are generated in the laser with constant current and there is no need for expensive pulsed current source or external components. Another advantage is that the frequency doubling efficiency is improved compared with prior art structures, which reduces the component power consumption and provides high brightness radiation from the laser. The biasing current also reduces the divergence of a second harmonic beam, which further increases the brightness of the radiation from the laser.

DESCRIPTION OF THE DRAWINGS

In the following the invention will be described in more detail with reference to the appended drawings, in which

FIG. 5 depicts the flow of current through the structure of the laser.

DETAILED DESCRIPTION OF THE INVENTION

Figure 1:
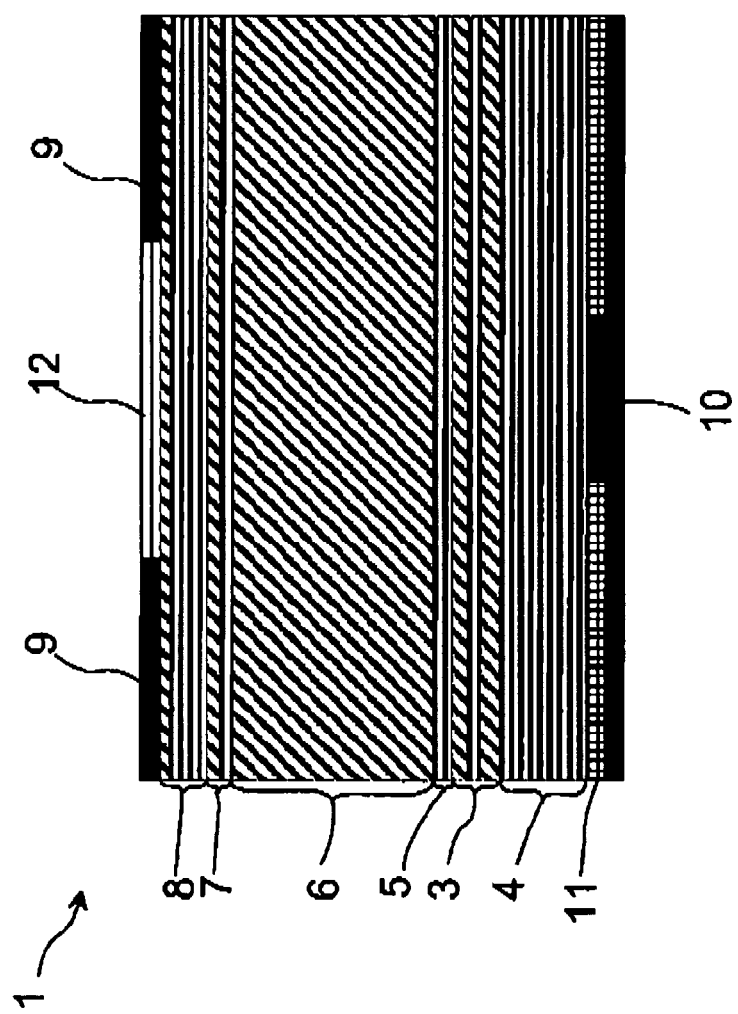
FIG. 1 depicts the structure of a laser according to an example embodiment of the present invention as a simplified cross-sectional view.

In FIG. 1 a structure of a laser 1 according to an example embodiment of the present invention is depicted as a simplified cross-sectional view. The laser is a single-crystal passively mode-locked semiconductor vertical-external-cavity surface-emitting laser (VECSEL). The laser structure is grown on a substrate (not shown in the figures). The material of the substrate is GaAs, InP or GaSb semiconductor compound. In this embodiment the substrate is only needed to grow the laser 1 and can be removed after forming the layers of the laser 1. In an example embodiment of the present invention the laser 1 is formed in the following way. First, a bottom reflector 4 is grown on the substrate. The bottom reflector 4 is a Distributed Bragg Reflector. Then an active region 3 (gain region) of the laser according to the present invention is sandwiched between a bottom reflector 4 and a partial reflector. Therefore, the gain region 3 is grown on the bottom reflector 4 after which the first partial reflector 5 is grown on the gain region 3 using appropriate semiconductor material compounds. The first partial reflector 5 comprises a number of quarter wavelength pairs and forms the structure of Distributed Bragg Reflector (DBR). The active region 3 is formed in such a way that it comprises a number of quantum wells (QW) made of GaInAs, GaInAsP, GaInNAs, GaIn-NAsSb, AlGaAs or GaAsP. The fundamental lasing wavelength of the laser 1 can be chosen by appropriate selection of the material of the gain region (gain material).

The reflectivity of the bottom reflector 4 is selected close to 100% and the reflectivity of the first partial reflector 5 is selected to be less than the reflectivity of the bottom reflector 4. In some embodiments the reflectivity of the first partial reflector 5 is near 0% thus being almost antireflective. In one embodiment, the first partial reflector 5 is antireflective. For example, the reflectivity of the first partial reflector 5 is between 25-85%.

A spacer layer 6 is formed on the surface of the first partial reflector 5. After that, a semiconductor saturable absorber 7 can be grown on the spacer layer 6. Therefore, the spacer layer 6 separates the gain region 3 and the semiconductor saturable absorber 7. The saturable absorber 7 consists of one or more quantum wells made of GaInAs, GaInAsP, GaInNAs, GaIn-NAsSb, AlGaAs or GaAsP and a second partial reflector 8. The quantum wells of the saturable absorber 7 can be of undoped, n-doped, p-doped or co-doped of such a semiconductor material that the optical energy emitted by the material of the gain region 3 is partly absorbed by the saturable absorber quantum well material. Also the second partial reflector 8 is a Distributed Bragg Reflector (DBR) having the reflectivity less than the reflectivity of the bottom reflector 4, for example between 25-85%. In an example embodiment of the present invention the reflectivity of the first partial reflector 5 and the second partial reflector 8 is selected to be about the same.

After the layers are grown on the substrate, the substrate can be removed e.g. by etching.

For supplying the current to the laser a first contact 9 and a second contact are formed to the laser 1 e.g. by metallization. The first contact 9 (n-contact) is in electrical contact with the second partial reflector 8 of the saturable absorber 7. The second contact 10 (p-contact) is in electrical contact with the bottom reflector 4 of the laser 1. Therefore, the first 9 and second contact 10 are metallized on opposite sides of the laser 1 in this example embodiment. The first contact 9 has an annular shape i.e. having a dielectric coated output window 12 in the centre region. The second contact 10 is preferably a circle and it is positioned below the output window 12 of the first contact 9 in the direction of the emitted radiation. Further, the diameter of the second contact 10 is smaller than the outer diameter of the first contact 9. Preferably, the diameter of the second contact 10 is even smaller than the inner diameter of the first contact 9. When an electrical power is connected to the first 9 and second contact 10, a laser diode current (biasing current) begins to flow through the layer structure of the laser 1 thus partially saturating the semiconductor saturable absorber 7. The flow of the current is shown with reference 13 in FIG. 5. The mutual location and structure of the first 9 and the second contact 10 effects that the current flow has a conical shape as can be seen from FIG. 5. This has the effect that a so-called thermal lens (illustrated with an ellipse 19 in FIG. 5) is generated in the laser device focusing the emitted radiation. It should be noted here that in the laser 1 of FIG. 1, the second contact 10 has a larger area than described above, but an insulating layer 11 is formed partly between the second contact layer 10 and the bottom reflector 4 in such a way that only a portion of the second contact 10 is in electrical contact with the bottom reflector 4.

The biasing current density is chosen in such a way that the saturable absorber 7 is partially saturated by the operating current. This lowers the saturation photon intensity. Therefore, the semiconductor saturable absorber 7 modulates the gain in the cavity of the laser 1 as a function of intensity, which mode-locks the laser 1 without any active control.

The thickness of the spacer layer 6 can be selected so that the thickness of the laser cavity is an integer of the wavelength of the radiation generated in the gain region 3.

Figure 2:
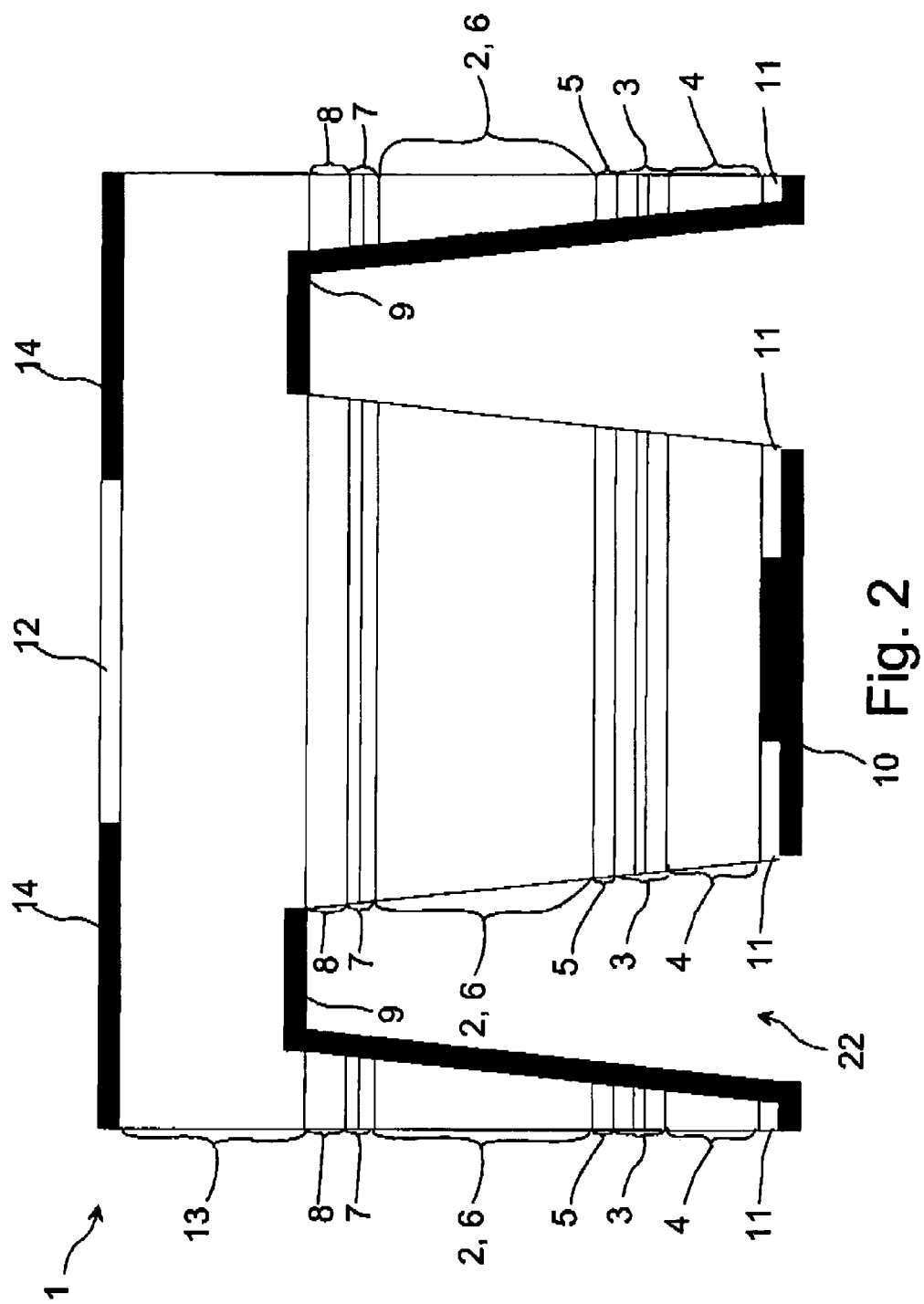
FIG. 2 depicts the structure of a laser according to an example embodiment of the present invention as a simplified cross-sectional view.

FIG. 2 depicts a second example embodiment of the laser 1 according to the present invention. In this embodiment the contacts 9, 10 are both formed on the same side of the substrate. In this case the first contact 9 is formed by etching through the layer structure i.e. through the layers from the bottom reflector 4 to the second partial reflector 8 and forming an ohmic contact above the second partial reflector 8. The ohmic contact is formed e.g. by adding a semiconductor contact layer 13 on the second partial reflector 8. There is also a third metallic layer 14 formed on the second partial reflector 8. In this embodiment the etching forms a kind of a groove 22 penetrating through the layers from the bottom reflector 4 to the second partial reflector 8, wherein the first contact layer 9 is formed on the surface of the groove 22 e.g. by metallization.

Figure 3:
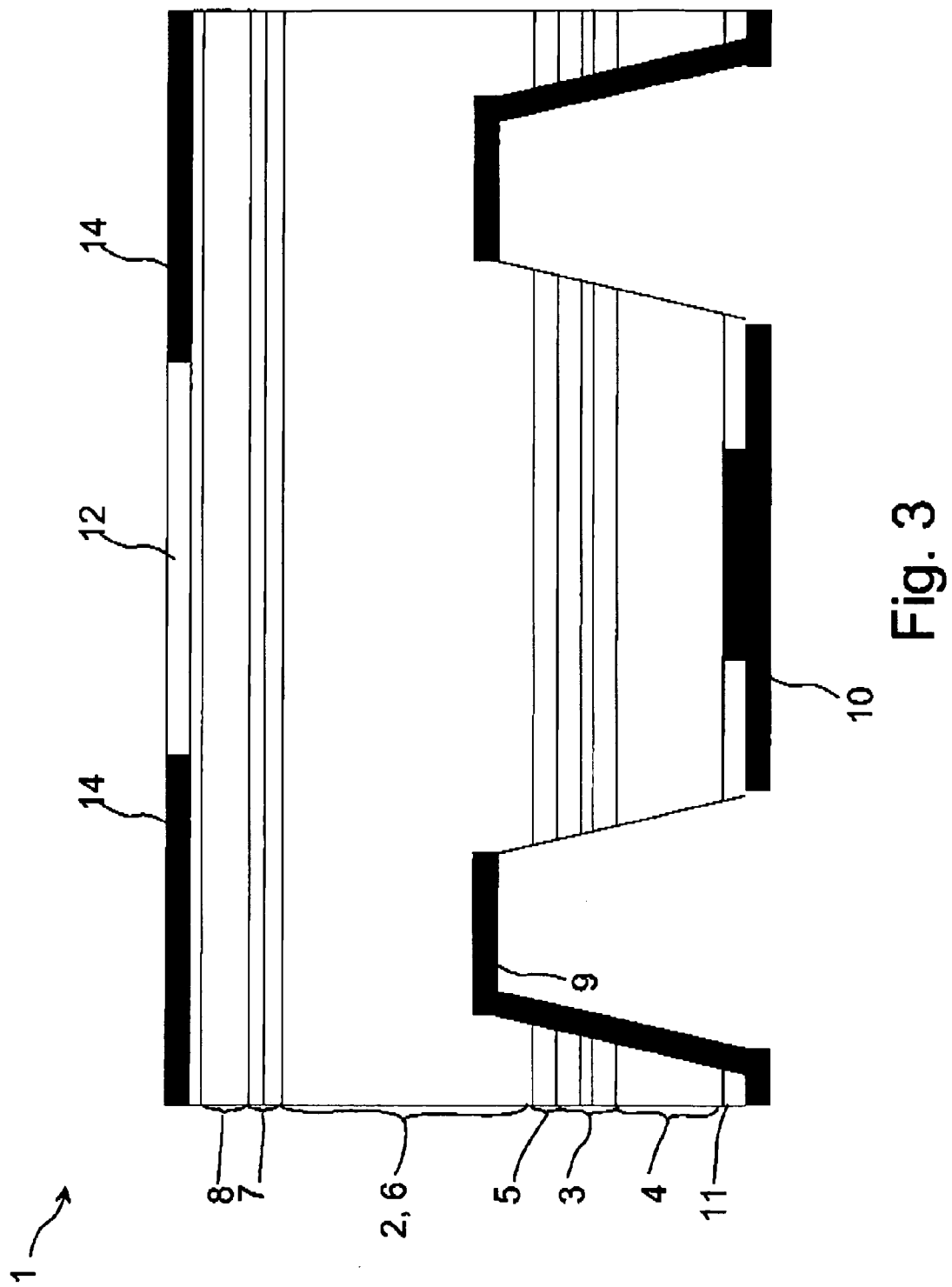
FIG. 3 depicts the structure of a laser according to an example embodiment of the present invention as a simplified cross-sectional view.

A third example embodiment of the laser 1 according to the present invention is shown in FIG. 3. In this embodiment the voltage across the saturable absorber 7 can be controlled by a third contact 14, made of a conducting material such as a metal. It is noticeable that the saturable absorber 7 consists of a number of quantum wells, preferably more than one, and a single partial reflector 8. The quantum wells are located in the antinode of the optical field. In case of the three-contact design, the second partial reflector 8 in the saturable absorber 7 is made of variable composition of p-type AlGaAs.

Figure 4:
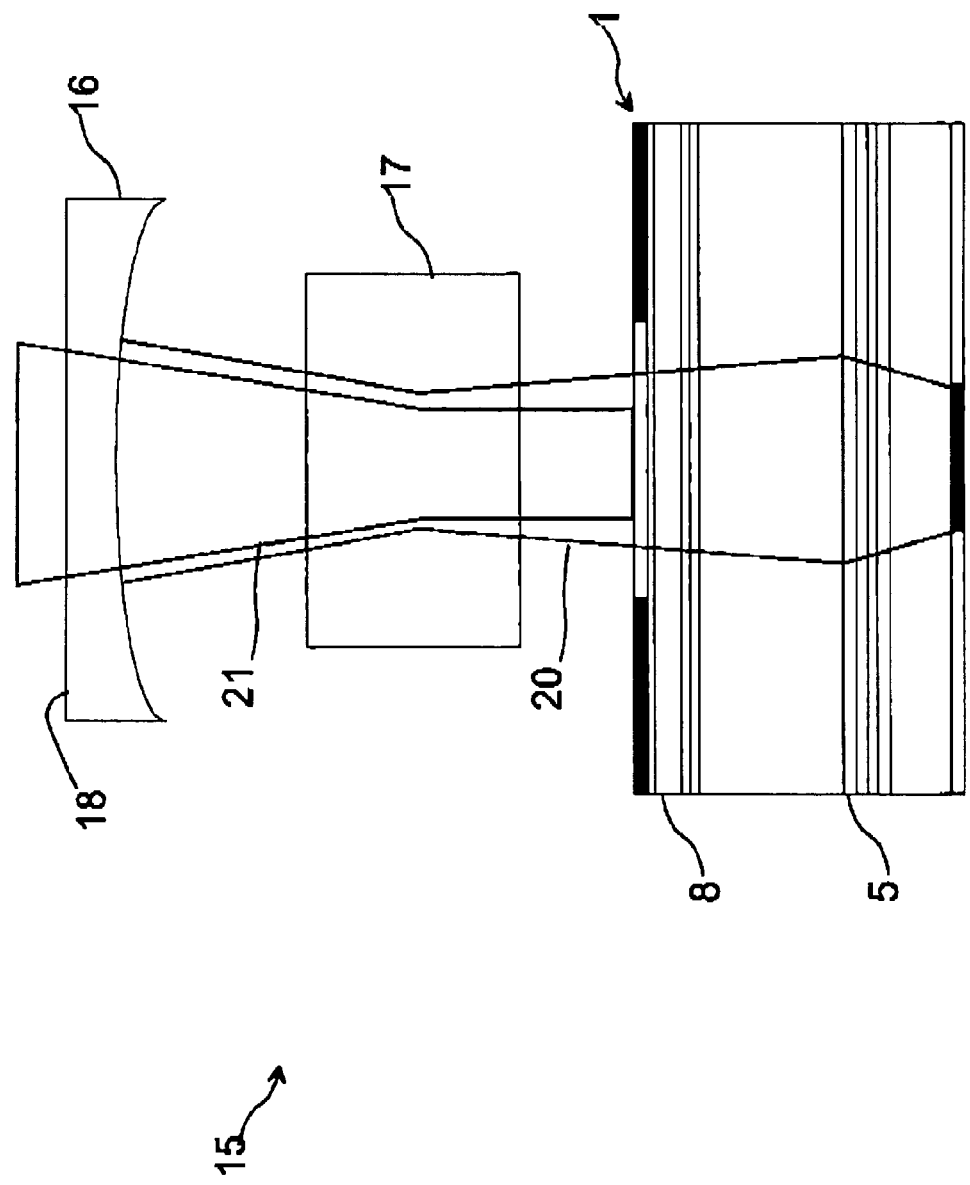
FIG. 4 depicts the structure of a laser according to an example embodiment of the present invention as a simplified cross-sectional view.

FIG. 4 depicts a device 15 in which the laser according to the present invention is used. The device 15 comprises an output coupler mirror 16 which is aligned with the laser chip 1 to form an external cavity. A nonlinear crystal 17 is placed inside the external cavity to generate visible double frequency 21 of the fundamental infrared laser radiation 20. The reflectivity of the output coupler mirror 16 is chosen to be high for the fundamental wavelength 20 and low for the second harmonic 21. The exit surface 18 of the output coupler mirror 16 is antireflection coated for the second harmonic wavelength. The laser cavity is aligned in such a way that the laser 1 oscillates in $TEM_{00}$ mode for efficient second harmonic generation. The reflectivity of the partial reflectors 5, 8 is chosen in such a way that the lasing threshold cannot be reached without the output coupler mirror 16.

The device 15 can also be used without the nonlinear crystal 17 to generate mode-locked pulses of the fundamental wavelength radiation. In this case the reflectivity of the output coupler mirror 16 is less than 100%.

The semiconductor saturable absorber is acting as passive mode-locking device causing self-pulsing of the external-cavity laser device 15. The conversion efficiency of the nonlinear crystal 17 depends strongly on the intensity of the light and thus the high-intensity fundamental wavelength pulses with high repetition rate increase the average second harmonic light output. The advantage of the passive mode-locking with integrated saturable absorber 7 is the reduction of the manufacturing costs and the simplicity of the cavity configuration.

In practical implementations there can also be more than one laser 1 on the same chip. For example, a number of lasers 1 can be formed as a laser matrix (not shown) on a semiconductor chip.

I claim:

1. A VECSEL laser without a substrate comprising:
   a saturable absorber comprising at least one quantum well;
   an active region with a number of quantum wells;
   a bottom reflector;
   a first partial reflector and a second partial reflector;
   a spacer layer on the surface of the first partial reflector configured for keeping the active region and the saturable absorber separate; wherein the absorber, the active region, the bottom reflector, the first partial reflector; the spacer layer and the second partial reflector forming a stack of semiconductor layers; and
   at least one first contact and a second contact for conducting a biasing current through the saturable absorber to reduce saturation photon intensity in the saturable absorber; wherein the at least one first contact and the second contact are formed on a common side of the laser, and the at least one first contact is formed on a surface of a groove penetrating through layers of the laser from at least the bottom reflector to at least the second partial reflector; and
   wherein the intensity of the biasing current is configured to be selected to be below a saturation level of the at least one quantum well of the saturable absorber; and the reflectivity of said first and second partial reflectors is less than a lasing threshold;
   wherein the VECSEL laser further comprises an output coupler mirror to reach said lasing threshold.

2. A laser according to claim 1, wherein said first contact has a shape of an annular ring, and said second contact has a shape of a circle.

3. A laser according to claim 1, wherein said first contact has an annular shape, and said second contact has a circular shape.

4. A laser according to claim 3, wherein a diameter of the second contact is smaller than the outer diameter of the first contact.

5. A laser according to claim 1, wherein the reflectivity of the bottom reflector is close to 100%, and the reflectivity of the first partial reflector is less than the reflectivity of the bottom reflector.

6. A laser according to claim 5, wherein the first partial reflector is antireflective.

7. A laser according to claim 1, wherein the saturable absorber consists of a plurality of quantum wells and a single partial reflector.

8. A laser according to claim 1 configured to generate an optical field, wherein said number of quantum wells are located in the antinode of the generated optical field.

9. A laser according to claim 1 further comprising a third contact configured to control the voltage across the saturable absorber.

10. A device having at least one VECSEL laser without a substrate, said VECSEL comprisinq:
   a saturable absorber comprising at least one quantum well;
   an active region with a number of quantum wells;
   a first partial reflector and a second partial reflector;
   a spacer layer on the surface of the first partial reflector configured for keeping the active region and the saturable absorber separate; wherein the absorber, the active region, a bottom reflector, the first partial reflector; the spacer layer and the second partial reflector forming a stack of semiconductor layers;
   an output coupler mirror;
   at least one first contact and a second contact for conducting a biasing current through the saturable absorber to reduce saturation photon intensity in the saturable absorber wherein the at least one first contact and the second contact are formed on a common side of the laser, and the at least one first contact is formed on a surface of a groove penetrating through layers of the laser from at least the bottom reflector to at least the second partial reflector; and wherein the intensity of the biasing current is configured to be selected to be below a saturation level of the at least one quantum well of the saturable absorber; and the reflectivity of the partial reflectors is such that a lasing threshold cannot be reached without the output coupler mirror.

11. A method for passive mode-locking a laser comprising:
a saturable absorber comprising at least one quantum well;
an active region with a number of quantum wells;
a first partial reflector and a second partial reflector,
a spacer layer on the surface of the first partial reflector configured for keeping the active region and the saturable absorber separate; wherein the absorber, the active region, the bottom reflector, the first partial reflector and the second partial reflector forming a stack of semiconductor layers;
an output coupler mirror;
at least one first contact; and a second contact formed on a common side of the laser, wherein the at least one first contact is formed on a surface of a groove penetrating through layers of the laser from at least the bottom reflector to at least the second partial reflector;
wherein the reflectivity of the partial reflectors is such that a lasing threshold cannot be reached without the output coupler mirror;
wherein the method comprises:
providing a biasing current flow between the first and the second contact of the laser flowing through the saturable absorber to reduce saturation photon intensity in the saturable absorber; and
selecting the density of the biasing current in the saturable absorber to be below a saturation level of the at least one quantum well of the saturable absorber.

12. The device of claim 10 further comprising that the at least one first contact has an annular shape and the second contact has a circular shape.

13. The device of claim 10 further comprising that a diameter of the second contact is smaller that the outer diameter of the at least one first contact.

14. The device of claim 10, further comprising a bottom reflector, wherein the reflectivity of the bottom reflector is close to 100%, and the reflectivity of the first partial reflector is less than the reflectivity of the bottom reflector.

15. The device according to claim 10, wherein the saturable absorber comprises a plurality of quantum wells and a single partial reflector.

16. The device of claim 10 further comprising that the first partial reflector is anti-reflective.

17. The method of claim 11 further comprising that the at least one first contact has an annular shape and the second contact has a circular shape.

18. The method of claim 11 further comprising that a diameter of the second contact is smaller that the outer diameter of the at least one first contact.

19. The method of claim 11, wherein the saturable absorber comprises a plurality of quantum wells and a single partial reflector.

20. The method of claim 11 further comprising that the first partial reflector is anti-reflective.

21. The laser according to claim 1 further comprising that the active region is on the bottom reflector, the first partial reflector is on the active region, the saturable absorber is on the first partial reflector and the second partial reflector is on the saturable absorber.

22. The laser according to claim 1 wherein the at least one first contact and the second contact form a pair of contacts for conducting a forward biasing current through the saturable absorber.

* * * * *

UNITED STATES PATENT AND TRADEMARK OFFICE
CERTIFICATE OF CORRECTION

PATENT NO. : 7,801,197 B2
APPLICATION NO. : 11/454631
DATED : September 21, 2010
INVENTOR(S) : Janne Konttinen It is certified that error appears in the above-identified patent and that said Letters Patent is hereby corrected as shown below:

Column 6, line 51, in Claim 10, delete "comprisinq:" and insert -- comprising: --, therefor.

Column 6, line 58, in Claim 10, delete "a" and insert -- the --, therefor.

Column 8, line 5, in Claim 13, delete "smaller that the outer diameter" and insert -- smaller than the outer diameter --, therefor.

Column 8, line 20-21, in Claim 18, delete "smaller that the outer diameter" and insert -- smaller than the outer diameter --, therefor.

Signed and Sealed this

Seventh Day of December, 2010

David J. Kappos
*Director of the United States Patent and Trademark Office*